United States Patent
Endo et al.

(10) Patent No.: US 12,222,651 B2
(45) Date of Patent: Feb. 11, 2025

(54) RESIST UNDERLAYER FILM FORMING COMPOSITION HAVING A DISULFIDE STRUCTURE

(71) Applicant: NISSAN CHEMICAL CORPORATION, Tokyo (JP)

(72) Inventors: Takafumi Endo, Toyama (JP); Yuichi Goto, Toyama (JP); Yasunobu Someya, Toyama (JP); Ryuta Mizuochi, Toyama (JP); Satoshi Kamibayashi, Toyama (JP)

(73) Assignee: NISSAN CHEMICAL CORPORATION, Tokyo (JP)

( * ) Notice: Subject to any disclaimer, the term of this patent is extended or adjusted under 35 U.S.C. 154(b) by 1054 days.

(21) Appl. No.: 16/964,869

(22) PCT Filed: Feb. 1, 2019

(86) PCT No.: PCT/JP2019/003574
§ 371 (c)(1),
(2) Date: Jul. 24, 2020

(87) PCT Pub. No.: WO2019/151471
PCT Pub. Date: Aug. 8, 2019

(65) Prior Publication Data
US 2021/0063881 A1 Mar. 4, 2021

(30) Foreign Application Priority Data

Feb. 2, 2018 (JP) ................................ 2018-017167
Jun. 26, 2018 (JP) ................................ 2018-121282

(51) Int. Cl.
| | |
|---|---|
| G03F 7/11 | (2006.01) |
| C09D 179/04 | (2006.01) |
| H01L 21/027 | (2006.01) |
| G03F 7/16 | (2006.01) |
| G03F 7/20 | (2006.01) |
| G03F 7/30 | (2006.01) |

(52) U.S. Cl.
CPC .............. G03F 7/11 (2013.01); C09D 179/04 (2013.01); H01L 21/0274 (2013.01); *G03F 7/16* (2013.01); *G03F 7/20* (2013.01); *G03F 7/30* (2013.01)

(58) Field of Classification Search
CPC . G03F 7/094; G03F 7/092; G03F 7/11; C09D 201/08; C09D 163/06; C08G 16/0237
See application file for complete search history.

(56) References Cited

U.S. PATENT DOCUMENTS

| | | |
|---|---|---|
| 2011/0053091 A1 | 3/2011 | Hiroi et al. |
| 2015/0017791 A1 | 1/2015 | Ohashi et al. |
| 2017/0038687 A1* | 2/2017 | Ogata ..................... G03F 7/094 |
| 2018/0181001 A1* | 6/2018 | Endo ...................... G03F 7/2037 |
| 2020/0201183 A1 | 6/2020 | Ogata et al. |

FOREIGN PATENT DOCUMENTS

| | | | | |
|---|---|---|---|---|
| CN | 104094381 A | 10/2014 | | |
| JP | 2013-033276 A | 2/2013 | | |
| JP | 2014-010382 A | 1/2014 | | |
| JP | 2017-120359 A | 7/2017 | | |
| KR | 10-2017-0081877 A | 7/2017 | | |
| WO | 2009/096340 A1 | 8/2009 | | |
| WO | WO2015/098525 | * | 7/2015 | ................ G03F 7/11 |
| WO | WO-2017002653 A1 | * | 1/2017 | ............. C08G 59/18 |
| WO | 2018/012253 A1 | 1/2018 | | |

OTHER PUBLICATIONS

Apr. 23, 2019 International Search Report issued in International Patent Application No. PCT/JP2019/003574.
Feb. 21, 2024 Office Action issued in Chinese Patent Application No. 201980010876.5.

* cited by examiner

*Primary Examiner* — Daborah Chacko-Davis
(74) *Attorney, Agent, or Firm* — Oliff PLC

(57) ABSTRACT

A resist underlayer film having, in particular, a high dry etching speed; the resist underlayer film formation composition; a resist pattern formation method, and a method for manufacturing a semiconductor device. The resist underlay film formation composition contains: a bifunctional or higher compound having one or more disulfide bonds; a trifunctional or higher compound and/or a reaction product; and a solvent. The bifunctional or higher compound is a dicarboxylic acid containing a disulfide bond. The trifunctional or higher compound is a compound containing three or more epoxy groups.

12 Claims, No Drawings

RESIST UNDERLAYER FILM FORMING COMPOSITION HAVING A DISULFIDE STRUCTURE

TECHNICAL FIELD

The present invention relates to a composition for forming a resist underlayer film having especially high dry etching rate, a resist underlayer film using the resist underlayer film forming composition and a method for producing the composition, a method for forming a resist pattern, and a method for producing a semiconductor device.

BACKGROUND ART

When a resist film is subjected to exposure, reflected waves may adversely affect the resist film. A resist underlayer film formed for the purpose of suppressing the adverse effect is called also an antireflection film.

The resist underlayer film is required to easily be formed merely by applying a resist underlayer film forming composition in the form of a solution and curing the composition. Therefore, the composition for forming the resist underlayer film needs to contain a compound (polymer) which is readily cured by, for example, heating and which has a high solubility in a predetermined solvent.

It is desired that the resist pattern formed on the resist underlayer film has a cross-section, taken along the direction perpendicular to the substrate, which is rectangular (straight bottom form free from the so-called undercut, footing and others). For example, when the resist pattern has an undercut or footing profile, problems are caused in that the resist pattern collapses, and in that a material to be processed (such as a substrate or an insulating film) cannot be processed into a desired form or size in the lithography step.

Further, the resist underlayer film is required to have a larger dry etching rate than that of a resist film formed on the film, i.e., a large selective ratio for dry etching rate.

Patent Literature 1 discloses a resist underlayer film forming composition using a polymer having a disulfide linkage in the main chain thereof.

CITATION LIST

Patent Literature

Patent Literature 1: JP 2009-096340 A

SUMMARY OF INVENTION

Technical Problem

In the production of semiconductor elements, a resist underlayer film having a high dry etching rate has been still desired. It has been known that a resist underlayer film having a high dry etching rate is obtained by applying a polymer containing a heteroatom as the polymer used in the composition for forming the film.

The present inventors have made studies on various types of compounds and reaction products thereof (oligomers and polymers) with a view to obtaining a resist underlayer film containing a heteroatom in a higher concentration. As a result, it has been found that, particularly, with respect to the reaction product of a tri- or higher functional epoxy compound and a dicarboxylic acid, a polymer of the reaction product becomes three-dimensional and hence is insolubilized, and it is difficult to apply such a polymer to a resist underlayer film, but, when using a bi- or higher functional compound having at least one disulfide linkage, preferably a dicarboxylic acid, the resultant reaction product is not insolubilized in a solvent but can maintain high dissolution properties. Further, it has been found that a disulfide group can be introduced into a polyfunctional epoxy compound at multiple sites, making it possible to achieve a higher etch rate than that obtained by the prior art techniques.

In view of the above-mentioned technical problems, an object of the present invention is to provide a composition for forming a resist underlayer film having especially high dry etching rate. Another object of the present invention is to provide a resist underlayer film using the resist underlayer film forming composition and a method for producing the composition, a method for forming a resist pattern, and a method for producing a semiconductor device.

Solution to Problem

The present invention encompasses the followings.

[1] A resist underlayer film forming composition comprising a bi- or higher functional compound having at least one disulfide linkage, a tri- or higher functional compound, and a solvent.

[2] A resist underlayer film forming composition comprising a solvent and a reaction product of a tri- or higher functional compound and a bi- or higher functional compound having at least one disulfide linkage.

[3] The resist underlayer film forming composition according to [1] or [2] above, wherein the bi- or higher functional compound is a dicarboxylic acid comprising a disulfide linkage.

[4] The resist underlayer film forming composition according to [1] or [2] above, wherein the tri- or higher functional compound is a compound containing three or more epoxy groups.

[5] The resist underlayer film forming composition according to [3] above, wherein the dicarboxylic acid comprising a disulfide linkage is represented by the following formula (1):

[Chemical formula 1]

$$HOOC-X_1-S-S-X_2-COOH \qquad \text{formula (1)}$$

wherein each of $X_1$ and $X_2$ independently represents an unsubstituted or substituted alkylene group having 1 to 10 carbon atoms, an unsubstituted or substituted arylene group having 6 to 40 carbon atoms, or a combination thereof.

[6] The resist underlayer film forming composition according to [5] above, wherein, in formula (1), each of $X_1$ and $X_2$ is independently an alkylene group having 1 to 3 carbon atoms.

[7] The resist underlayer film forming composition according to any one of [1], [2], and [4] above, wherein the tri- or higher functional compound comprises a heterocyclic structure.

[8] The resist underlayer film forming composition according to [7] above, wherein the heterocyclic structure comprises a triazine structure.

[9] The resist underlayer film forming composition according to any one of [1] to [8] above, which further comprises a crosslinking catalyst.

[10] The resist underlayer film forming composition according to any one of [1] to [9] above, which further comprises a crosslinking agent.

[11] The resist underlayer film forming composition according to any one of [1] to [10] above, which further comprises a surfactant.

[12] A resist underlayer film, which is a baked material of an applied film comprising the resist underlayer film forming composition according to any one of [1] to [11] above.

[13] A method for forming a resist pattern for use in producing a semiconductor device, wherein the method comprises the steps of: applying the resist underlayer film forming composition according to any one of [1] to [11] above onto a semiconductor substrate and baking the applied composition to form a resist underlayer film; applying a resist onto the resist underlayer film and baking the applied resist to form a resist film; subjecting the semiconductor substrate covered with the resist underlayer film and the resist to exposure; and subjecting the exposed resist film to development.

[14] A method for producing a semiconductor device, wherein the method comprises the steps of:

forming a resist underlayer film comprising the resist underlayer film forming composition according to any one of [1] to [11] above on a semiconductor substrate;

forming a resist film on the resist underlayer film;

irradiating the resist film with a light or an electron beam and subjecting the resultant resist film to development to form a resist pattern;

etching the resist underlayer film through the formed resist pattern to form a patterned resist underlayer film; and processing the semiconductor substrate using the patterned resist underlayer film.

[15] A method for producing a reaction product having at least one disulfide linkage, wherein the method comprises the step of reacting a bi- or higher functional compound having at least one disulfide linkage and a tri- or higher functional compound with each other.

[16] A method for producing a resist underlayer film forming composition, wherein the method comprises the step of reacting a bi- or higher functional compound having at least one disulfide linkage and a tri- or higher functional compound with each other.

[17] A method for producing a patterned substrate, wherein the method comprises the steps of: applying the resist underlayer film forming composition according to any one of [1] to [11] above onto a semiconductor substrate and baking the applied composition to form a resist underlayer film; applying a resist onto the resist underlayer film and baking the applied resist to form a resist film; subjecting the semiconductor substrate covered with the resist underlayer film and the resist to exposure; and subjecting the exposed resist film to development to perform patterning.

Advantageous Effects of Invention

The resist underlayer film forming composition of the present invention is advantageous in that it has high dry etching rate and can solve various problems caused due to the reduction of the thickness of a resist film, making it possible to achieve microfabrication of an even smaller semiconductor substrate.

DESCRIPTION OF EMBODIMENTS

<Resist Underlayer Film Forming Composition, Method for Producing a Reaction Product Having at Least One Disulfide Linkage, and Method for Producing a Resist Underlayer Film Forming Composition>

The resist underlayer film forming composition of the present invention is a resist underlayer film forming composition, which comprises a bi- or higher functional compound having at least one disulfide linkage, a tri- or higher functional compound, and a solvent.

The "functional" is a general concept of a substance about the chemical characteristics or chemical reactivity, and the use of the term "functional group" is expected to be based on the inherent physical properties or chemical reactivity of each group, but, in the present invention, the term "functional group" means a reactive substituent which is capable of being bonded to another compound. Specifically, for example, the term "trifunctional" indicates having three reactive substituents in the compound. Specific examples of reactive substituents include a hydroxy group, an epoxy group, an acyl group, an acetyl group, a formyl group, a benzoyl group, a carboxyl group, a carbonyl group, an amino group, an imino group, a cyano group, an azo group, an azide group, a thiol group, a sulfo group, and an allyl group, and, of these, preferred is an epoxy group or a carboxyl group, and most preferred is an epoxy group.

The functional groups contained in the compound may be the same or different, but are preferably the same.

The expression "having at least one disulfide linkage" means "having at least one disulfide linkage" per molecule.

For each of the bi- or higher functional compound having at least one disulfide linkage and the tri- or higher functional compound, one or two or more compounds are used, but preferably three or less, preferably two or less, most preferably one compound is used.

The molar ratio of the tri- or higher functional compound and the bi- or higher functional compound having at least one disulfide linkage ranges, for example, 1:0.1 to 10, preferably 1:1 to 5, further preferably 1:3.

The above-mentioned compounds (bi- or higher functional compound having at least one disulfide linkage and tri- or higher functional compound) preferably have a molecular weight of 100 or more, respectively. The upper limit of the molecular weight of the compounds is, for example, 999.

The resist underlayer film forming composition of the present invention may contain a reaction product (an oligomer and/or a polymer) of a bi- or higher functional compound having at least one disulfide linkage and a tri- or higher functional compound.

The molar ratio of the bi- or higher functional compound having at least one sulfide linkage and the tri- or higher functional compound ranges, for example, 1:0.1 to 10, preferably 1:1 to 5, further preferably 1:3.

The reaction product in the present invention may be an oligomer, and preferably has a molecular weight of 300 or more. The upper limit of the molecular weight is, for example, 999. The reaction product (an oligomer and/or a polymer) may be produced by a known method or, for example, the method described in Japanese Patent No. 5041175.

The polymer that can be used is a polymer having a weight average molecular weight of, for example, 1,000 to 100,000, or 1,100 to 50,000, or 1,200 to 30,000, or 1,300 to 20,000.

The resist underlayer film forming composition of the present invention may contain the above-mentioned compounds and/or the above-mentioned reaction product.

The resist underlayer film forming composition of the present invention contains a bi- or higher functional compound having at least one disulfide linkage, but the bi- or higher functional compound having at least one disulfide linkage is preferably a bifunctional compound having at least one disulfide linkage, further preferably a dicarboxylic acid comprising a disulfide linkage, further preferably a dicarboxylic acid, in which a disulfide linkage interrupts an alkylene group having 2 or more carbon atoms, further preferably a dicarboxylic acid, in which a disulfide linkage interrupts an alkylene group having 2 to 10 carbon atoms.

The dicarboxylic acid comprising a disulfide linkage is preferably represented by the following formula (1):

[Chemical formula 2]

$$HOOC-X_1-S-S-X_2-COOH \qquad \text{formula (1)}$$

wherein each of $X_1$ and $X_2$ independently represents an unsubstituted or substituted alkylene group having 1 to 10 carbon atoms, an unsubstituted or substituted arylene group having 6 to 40 carbon atoms, or a combination thereof.

$X_1$ and $X_2$ may be the same or different, but are preferably the same.

Examples of the alkylene groups having 1 to 10 carbon atoms include a methylene group, an ethylene group, a n-propylene group, an isopropylene group, a cyclopropylene group, a n-butylene group, an isobutylene group, a s-butylene group, a t-butylene group, a cyclobutylene group, a 1-methyl-cyclopropylene group, a 2-methyl-cyclopropylene group, a n-pentylene group, a 1-methyl-n-butylene group, a 2-methyl-n-butylene group, a 3-methyl-n-butylene group, a 1,1-dimethyl-n-propylene group, a 1,2-dimethyl-n-propylene group, a 2,2-dimethyl-n-propylene group, a 1-ethyl-n-propylene group, a cyclopentylene group, a 1-methyl-cyclobutylene group, a 2-methyl-cyclobutylene group, a 3-methyl-cyclobutylene group, a 1,2-dimethyl-cyclopropylene group, a 2,3-dimethyl-cyclopropylene group, a 1-ethyl-cyclopropylene group, a 2-ethyl-cyclopropylene group, a n-hexylene group, a 1-methyl-n-pentylene group, a 2-methyl-n-pentylene group, a 3-methyl-n-pentylene group, a 4-methyl-n-pentylene group, a 1,1-dimethyl-n-butylene group, a 1,2-dimethyl-n-butylene group, a 1,3-dimethyl-n-butylene group, a 2,2-dimethyl-n-butylene group, a 2,3-dimethyl-n-butylene group, a 3,3-dimethyl-n-butylene group, a 1-ethyl-n-butylene group, a 2-ethyl-n-butylene group, a 1,1,2-trimethyl-n-propylene group, a 1,2,2-trimethyl-n-propylene group, a 1-ethyl-1-methyl-n-propylene group, a 1-ethyl-2-methyl-n-propylene group, a cyclohexylene group, a 1-methyl-cyclopentylene group, a 2-methyl-cyclopentylene group, a 3-methyl-cyclopentylene group, a 1-ethyl-cyclobutylene group, a 2-ethyl-cyclobutylene group, a 3-ethyl-cyclobutylene group, a 1,2-dimethyl-cyclobutylene group, a 1,3-dimethyl-cyclobutylene group, a 2,2-dimethyl-cyclobutylene group, a 2,3-dimethyl-cyclobutylene group, a 2,4-dimethyl-cyclobutylene group, a 3,3-dimethyl-cyclobutylene group, a 1-n-propyl-cyclopropylene group, a 2-n-propyl-cyclopropylene group, a 1-isopropyl-cyclopropylene group, a 2-isopropyl-cyclopropylene group, a 1,2,2-trimethyl-cyclopropylene group, a 1,2,3-trimethyl-cyclopropylene group, a 2,2,3-trimethyl-cyclopropylene group, a 1-ethyl-2-methyl-cyclopropylene group, a 2-ethyl-1-methyl-cyclopropylene group, a 2-ethyl-2-methyl-cyclopropylene group, a 2-ethyl-3-methyl-cyclopropylene group, a n-heptylene group, a n-octylene group, a n-nonylene group, and a n-decanylene group.

Examples of the arylene groups having 6 to 40 carbon atoms include a phenylene group, an o-methylphenylene group, a m-methylphenylene group, a p-methylphenylene group, an α-naphthylene group, a β-naphthylene group, an o-biphenylylene group, a m-biphenylylene group, a p-biphenylylene group, a 1-anthrylene group, a 2-anthrylene group, a 9-anthrylene group, a 1-phenanthrylene group, a 2-phenanthrylene group, a 3-phenanthrylene group, a 4-phenanthrylene group, and a 9-phenanthrylene group.

Examples of substituents for the above alkylene groups and arylene groups include a halogen atom (fluorine, chlorine, bromine, or iodine), a nitro group, a cyano group, an amino group, a hydroxy group, a carbonyl group, a carbonyloxy group, a methoxy group, and an ethoxy group, but the substituent is not limited to these.

In formula (1) above, $X_1$ and $X_2$ are the same or different, and each of $X_1$ and $X_2$ is preferably independently an alkylene group having 1 to 3 carbon atoms. The alkylene group having 1 to 3 carbon atoms is preferably a methylene group, an ethylene group, an ethylidene group, a trimethylene group, a propylene group, a propylidene group, or an isopropylene group, especially preferably a methylene group or an ethylene group.

$X_1$ and $X_2$ may be independently a combination of the one or two or more alkylene groups having 1 to 10 carbon atoms and optionally being substituted and the one or two or more arylene groups having 6 to 40 carbon atoms and optionally being substituted.

$X_1$ and $X_2$ are preferably independently a combination of the unsubstituted or substituted alkylene group having 1 to 10 carbon atoms and the unsubstituted or substituted arylene group having 6 to 40 carbon atoms. Examples of especially preferred compounds of dicarboxylic acid (B) used in the present invention, which have a disulfide linkage and is represented by formula (1) above, include compounds represented by the following formulae (B-1) to (B-4).

[Chemical formula 3]

formula(B-1)

formula(B-2)

formula(B-3)

formula(B-4)

Preferred dicarboxylic acid (B) having a disulfide linkage is dithiodiglycolic acid of formula (B-1) or 3,3'-dithiodipropionic acid of formula (B-3).

The resist underlayer film forming composition of the present invention contains a tri- or higher functional compound, preferably contains a trifunctional compound.

The expression "containing three or more epoxy groups" means "containing three or more epoxy groups" per molecule.

The tri- or higher functional compound is preferably a compound containing three or more epoxy groups.

The tri- or higher functional compound is preferably a compound containing 3 to 10 epoxy groups, preferably a compound containing 3 to 8 epoxy groups, preferably a compound containing 3 to 6 epoxy groups, further preferably a compound containing three or four epoxy groups, most preferably a compound containing three epoxy groups.

Examples of compound (A) containing three or more epoxy groups include a glycidyl ether compound, a glycidyl ester compound, a glycidylamine compound, and a glycidyl group-containing isocyanurate. Examples of epoxy compound (A) used in the present invention include compounds represented by the following formulae (A-1) to (A-15).
[Chemical formula 4]
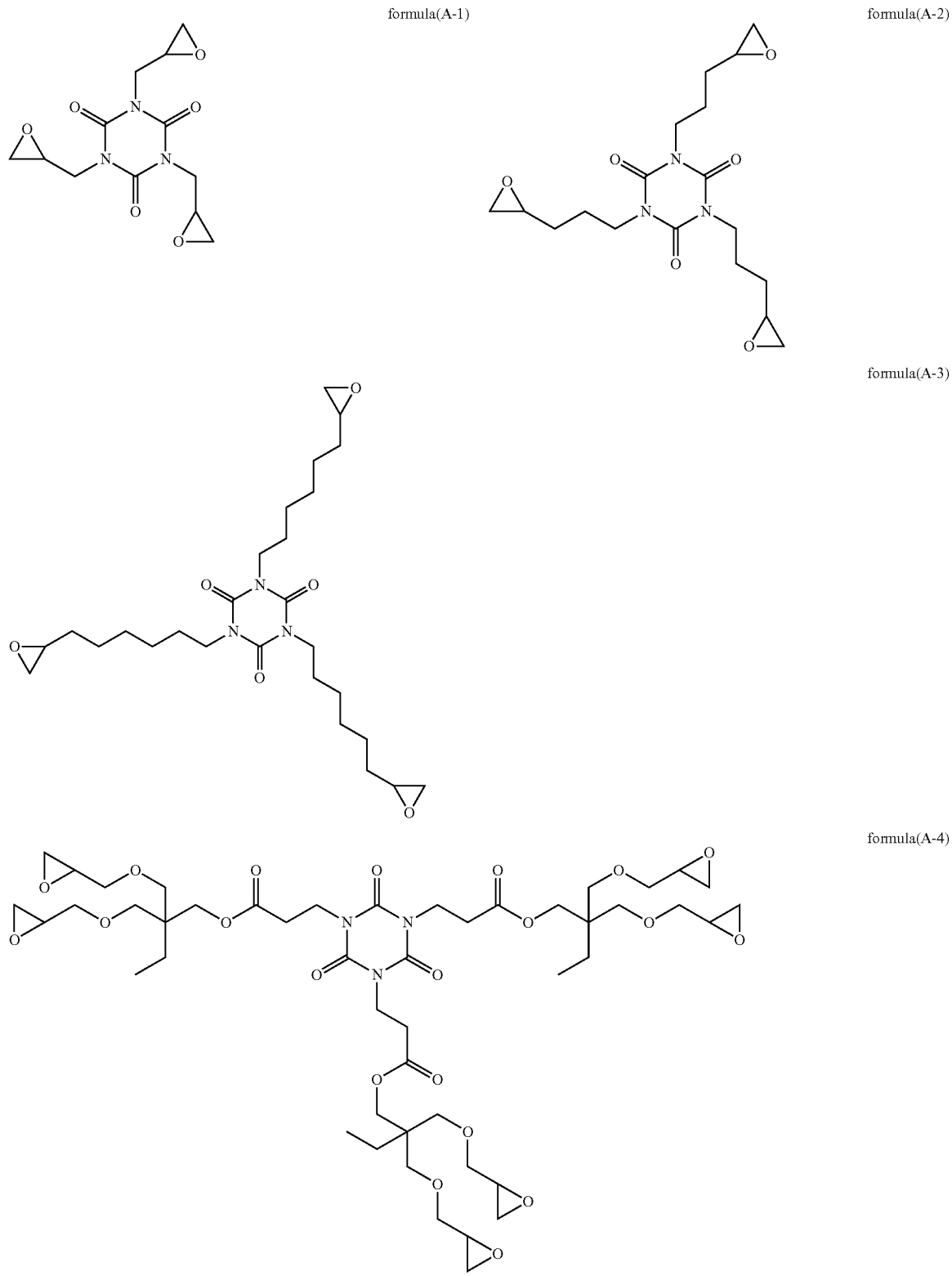

-continued
formula(A-5)
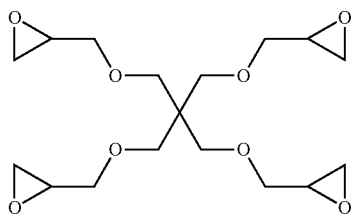
formula(A-6)
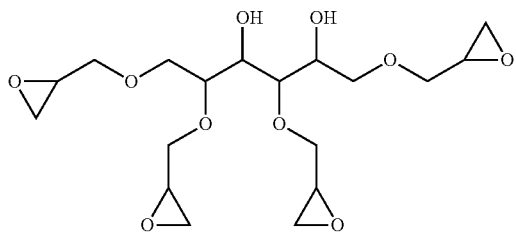
formula(A-7)
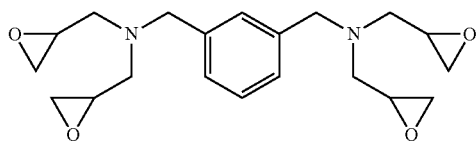
formula(A-8)
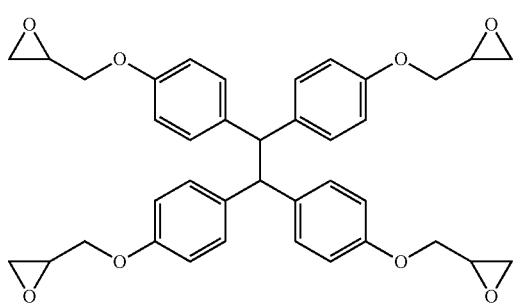
formula(A-9)
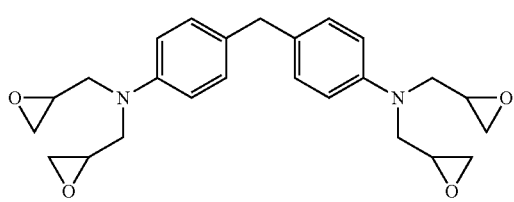
formula(A-10)
formula(A-11)
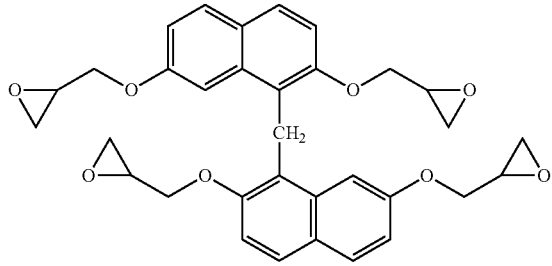
formula(A-12)
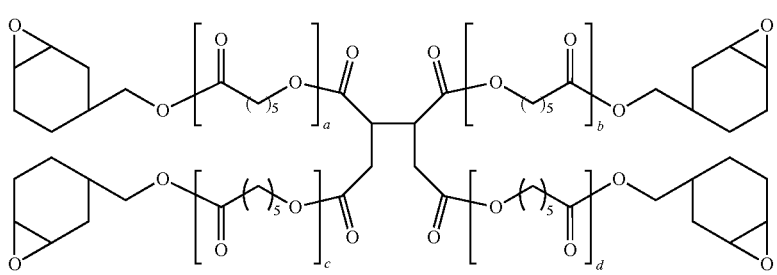

-continued formula(A-13)

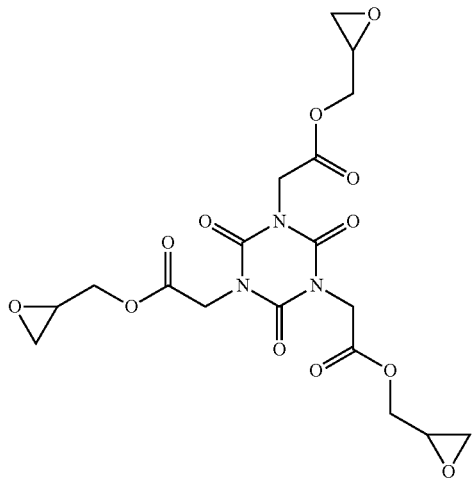

formula(A-14)

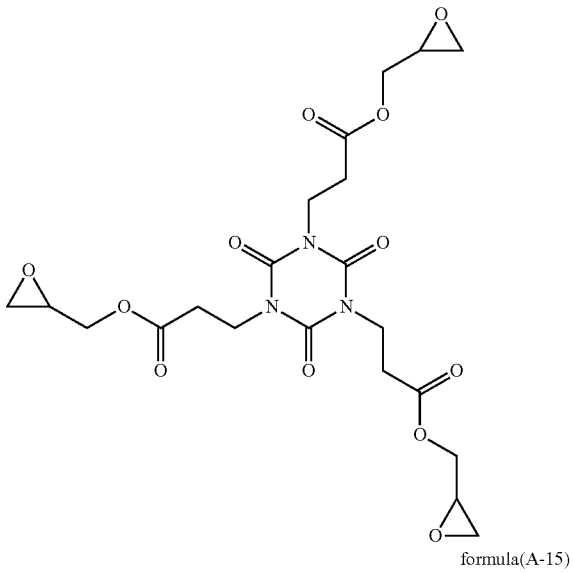

formula(A-15)

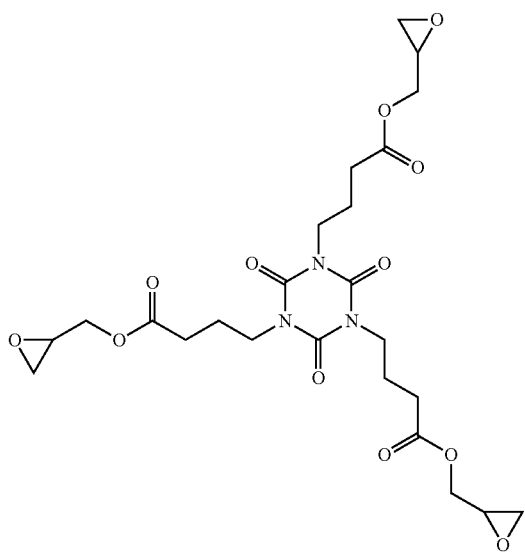

The compound of formula (A-1) is available as trade names: TEPIC-G, TEPIC-S, TEPIC-SS, TEPIC-HP, TEPIC-L (each of which is 1,3,5-tris(2,3-epoxypropyl) isocyanurate), manufactured by Nissan Chemical Corporation.

The compound of formula (A-2) is available as trade name: TEPIC-VL, manufactured by Nissan Chemical Corporation.

The compound of formula (A-3) is available as trade name: TEPIC-FL, manufactured by Nissan Chemical Corporation.

The compound of formula (A-4) is available as trade name: TEPIC-UC, manufactured by Nissan Chemical Corporation.

The compound of formula (A-5) is available as trade name: Denacol EX-411, manufactured by Nagase Chemtex Corporation.

The compound of formula (A-6) is available as trade name: Denacol EX-521, manufactured by Nagase Chemtex Corporation.

The compound of formula (A-7) is available as trade name: TETRAD-X, manufactured by Mitsubishi Gas Chemical Company, Inc.

The compound of formula (A-8) is available as trade name: BATG, manufactured by Showa Denko K.K.

The compound of formula (A-9) is available as trade name: YH-434L, manufactured by Nippon Steel & Sumikin Chemical Co., Ltd.

The compound of formula (A-10) is available as trade name: TEP-G, manufactured by Asahi Yukizai Corporation.

The compound of formula (A-11) is available as trade name: EPICLON HP-4700, manufactured by DIC Corporation.

The compound of formula (A-12) is available as trade name: Epolead GT401, manufactured by Daicel Corporation, wherein each of a, b, c, and d is 0 or 1, and a+b+c+d=1.

The tri- or higher functional compound preferably contains a heterocyclic structure.

Examples of the heterocycles include furan, thiophene, pyrrole, imidazole, pyran, pyridine, pyrimidine, pyrazine, pyrrolidine, piperidine, piperazine, morpholine, indole, purine, quinoline, isoquinoline, quinuclidine, chromene, thianthrene, phenothiazine, phenoxazine, xanthene, acridine, phenazine, carbazole, triazin-one, triazine-dione, and triazine-trione.

The heterocyclic structure is preferably a triazin-one, triazine-dione, or triazine-trione structure, most preferably a triazine-trione structure.

Compound (A) containing three or more epoxy groups is especially preferably 1,3,5-tris(2,3-epoxypropyl) isocyanurate of formula (A-1) or triglycidyl acetate isocyanurate of formula (A-13).

The bifunctional compound having at least one disulfide linkage and the trifunctional compound in the present invention may be specifically a reaction product having a structure of the following formulae (P-1) to (P-5).

[Chemical formula 5]

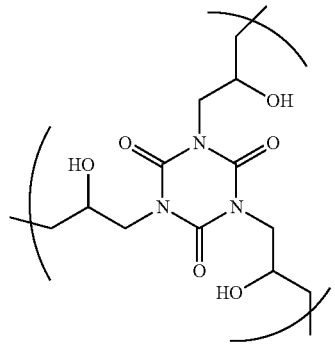

(formula P-1)

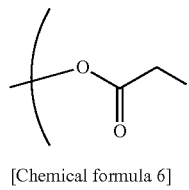

[Chemical formula 6]

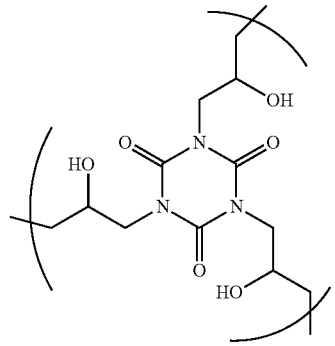

(formula P-2)

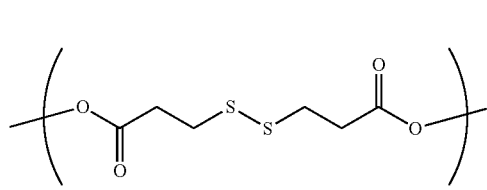

[Chemical formula 7]

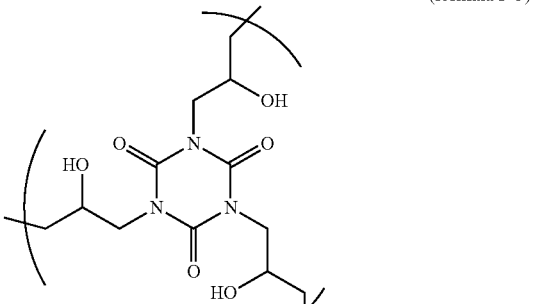

(formula P-3)

[Chemical formula 8]

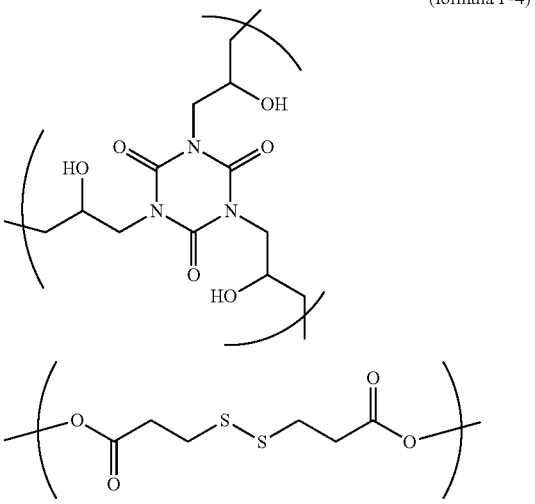

(formula P-4)

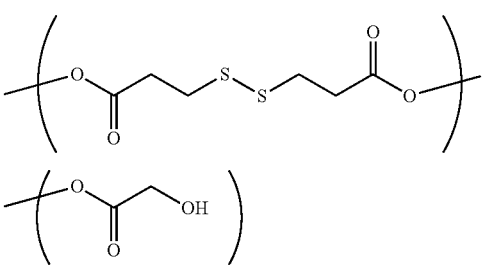

[Chemical formula 9]

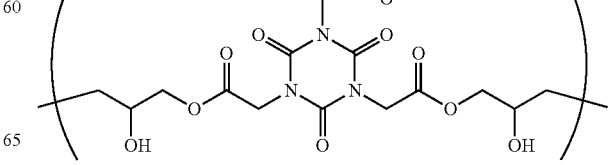

(formula P-5)

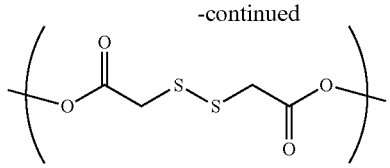

Further, the resist underlayer film forming composition of the present invention may further contain one, or two or more compounds different from the bi- or higher functional compound having at least one disulfide linkage and the tri- or higher functional compound. Examples of such compounds include compounds containing an acidic group and a hydroxy group. Specific examples include glycolic acid.

[Solvent]

The resist underlayer film forming composition of the present invention may be prepared by dissolving the above-mentioned components in an organic solvent, and is used in a uniform solution state.

With respect to the solvent for the resist underlayer film forming composition of the present invention, there is no particular limitation as long as it is a solvent which can dissolve therein the above-mentioned compounds or reaction product thereof, and any of such solvents may be used. Particularly, since the resist underlayer film forming composition of the present invention is used in a uniform solution state, and, taking the application properties of the composition into consideration, it is recommended that a solvent usually used in a lithography process should be also used.

Examples of the organic solvents include ethylene glycol monomethyl ether, ethylene glycol monoethyl ether, methyl cellosolve acetate, ethyl cellosolve acetate, diethylene glycol monomethyl ether, diethylene glycol monoethyl ether, propylene glycol, propylene glycol monomethyl ether, propylene glycol monoethyl ether, propylene glycol monomethyl ether acetate, propylene glycol propyl ether acetate, toluene, xylene, methyl ethyl ketone, methyl isobutyl ketone, cyclopentanone, cyclohexanone, cycloheptanone, 4-methyl-2-pentanol, methyl 2-hydroxyisobutyrate, ethyl 2-hydroxyisobutyrate, ethyl ethoxyacetate, 2-hydroxyethyl acetate, methyl 3-methoxypropionate, ethyl 3-methoxypropionate, ethyl 3-ethoxypropionate, methyl 3-ethoxypropionate, methyl pyruvate, ethyl pyruvate, ethyl acetate, butyl acetate, ethyl lactate, butyl lactate, 2-heptanone, methoxycyclopentane, anisole, γ-butyrolactone, N-methylpyrrolidone, N,N-dimethylformamide, and N,N-dimethylacetamide. These solvents can be used each alone or in combination.

Of these solvents, preferred are propylene glycol monomethyl ether, propylene glycol monomethyl ether acetate, ethyl lactate, butyl lactate, and cyclohexanone. Especially preferred are propylene glycol monomethyl ether and propylene glycol monomethyl ether acetate.

[Crosslinking Catalyst]

The resist underlayer film forming composition of the present invention may contain, as an optional component, a crosslinking catalyst for accelerating the crosslinking reaction. As the crosslinking catalyst, an acidic compound, a basic compound, or a compound capable of generating an acid or a base due to heat may be used. As the acidic compound, a sulfonic acid compound or a carboxylic acid compound may be used, and, as the compound capable of generating an acid due to heat, a thermal acid generator may be used.

Examples of sulfonic acid compounds or carboxylic acid compounds include p-toluenesulfonic acid, trifluoromethanesulfonic acid, pyridinium trifluoromethanesulfonate, pyridinium p-toluenesulfonate, salicylic acid, camphorsulfonic acid, 5-sulfosalicylic acid, 4-chlorobenzenesulfonic acid, 4-hydroxybenzenesulfonic acid, pyridinium 4-hydroxybenzenesulfonate, benzenedisulfonic acid, 1-naphthalenesulfonic acid, 4-nitrobenzenesulfonic acid, citric acid, benzoic acid, and hydroxybenzoic acid.

Examples of thermal acid generators include K-PURE [registered trademark] CXC-1612, K-PURE CXC-1614, K-PURE TAG-2172, K-PURE TAG-2179, K-PURE TAG-2678, K-PURE TAG2689 (each of which is manufactured by King Industries, Inc.), and SI-45, SI-60, SI-80, SI-100, SI-110, SI-150 (each of which is manufactured by Sanshin Chemical Industry Co., Ltd.).

These crosslinking catalysts may be used each alone or in combination. Further, as the basic compound, an amine compound or an ammonium hydroxide compound may be used, and, as the compound capable of generating a base due to heat, urea may be used.

Examples of amine compounds include tertiary amines, such as triethanolamine, tributanolamine, trimethylamine, triethylamine, trinormalpropylamine, triisopropylamine, trinormalbutylamine, tri-tert-butylamine, trinormaloctylamine, triisopropanolamine, phenyldiethanolamine, stearyldiethanolamine, and diazabicyclooctane, and aromatic amines, such as pyridine and 4-dimethylaminopyridine. Further examples of amine compounds include primary amines, such as benzylamine and normalbutylamine, and secondary amines, such as diethylamine and dinormalbutylamine. These amine compounds may be used each alone or in combination.

Examples of ammonium hydroxide compounds include tetramethylammonium hydroxide, tetraethylammonium hydroxide, tetrapropylammonium hydroxide, tetrabutylammonium hydroxide, benzyltrimethylammonium hydroxide, benzyltriethylammonium hydroxide, cetyltrimethylammonium hydroxide, phenyltrimethylammonium hydroxide, and phenyltriethylammonium hydroxide.

As the compound capable of generating a base due to heat, for example, a compound having a thermally unstable group, such as an amide group, an urethane group, or an aziridine group, so that it forms an amine by heating it may be used.

Further examples of the compounds capable of generating a base due to heat include urea, benzyltrimethylammonium chloride, benzyltriethylammonium chloride, benzyldimethylphenylammonium chloride, benzyldodecyldimethylammonium chloride, benzyltributylammonium chloride, and choline chloride.

When the resist underlayer film forming composition contains a crosslinking catalyst, the amount of the crosslinking catalyst contained ranges 0.0001 to 20% by weight, preferably 0.01 to 15% by weight, further preferably 0.1 to 10% by mass, based on the total solid content of the resist underlayer film forming composition.

Among the above-mentioned compounds, an acidic compound and/or a compound capable of generating an acid due to heat (crosslinking acid catalyst) is preferred.

[Crosslinking Agent]

The resist underlayer film forming composition of the present invention may contain a crosslinking agent component. Examples of the crosslinking agents include those based on melamine, substituted urea, or a polymer thereof. Preferred is a crosslinking agent having at least two crosslinking forming substituents, and examples include compounds, such as methoxymethylated glycoluril, butoxymethylated glycoluril, methoxymethylated melamine, butoxymethylated melamine, methoxymethylated benzoguanamine, butoxymethylated benzoguanamine, methoxymethylated urea, butoxymethylated urea, methoxymethylated thiourea, and methoxymethylated thiourea.

Further, a condensation product of the above compound may be used.

As the crosslinking agent, a crosslinking agent having a high heat resistance may be used. With respect to the crosslinking agent having a high heat resistance, a compound containing in the molecule thereof a crosslinking forming substituent having an aromatic ring (for example, a benzene ring or a naphthalene ring) may be used.

Examples of the compounds include compounds having a partial structure of formula (5-1) below, and polymers or oligomers having repeating units of formula (5-2) below.

[Chemical formula 10]

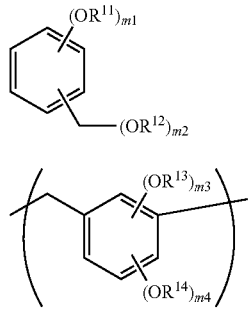

formula(5-1)

formula(5-2)

The above-mentioned $R^{11}$, $R^{12}$, $R^{13}$, and $R^{14}$ are a hydrogen atom or an alkyl group having 1 to 10 carbon atoms. Examples of alkyl groups having 1 to 10 carbon atoms include a methyl group, an ethyl group, a n-propyl group, an i-propyl group, a cyclopropyl group, a n-butyl group, an i-butyl group, a s-butyl group, a t-butyl group, a cyclobutyl group, a 1-methyl-cyclopropyl group, a 2-methyl-cyclopropyl group, a n-pentyl group, a 1-methyl-n-butyl group, a 2-methyl-n-butyl group, a 3-methyl-n-butyl group, a 1,1-dimethyl-n-propyl group, a 1,2-dimethyl-n-propyl group, a 2,2-dimethyl-n-propyl group, a 1-ethyl-n-propyl group, a cyclopentyl group, a 1-methyl-cyclobutyl group, a 2-methyl-cyclobutyl group, a 3-methyl-cyclobutyl group, a 1,2-dimethyl-cyclopropyl group, a 2,3-dimethyl-cyclopropyl group, a 1-ethyl-cyclopropyl group, a 2-ethyl-cyclopropyl group, a n-hexyl group, a 1-methyl-n-pentyl group, a 2-methyl-n-pentyl group, a 3-methyl-n-pentyl group, a 4-methyl-n-pentyl group, a 1,1-dimethyl-n-butyl group, a 1,2-dimethyl-n-butyl group, a 1,3-dimethyl-n-butyl group, a 2,2-dimethyl-n-butyl group, a 2,3-dimethyl-n-butyl group, a 3,3-dimethyl-n-butyl group, a 1-ethyl-n-butyl group, a 2-ethyl-n-butyl group, a 1,1,2-trimethyl-n-propyl group, a 1,2,2-trimethyl-n-propyl group, a 1-ethyl-1-methyl-n-propyl group, a 1-ethyl-2-methyl-n-propyl group, a cyclohexyl group, a 1-methyl-cyclopentyl group, a 2-methyl-cyclopentyl group, a 3-methyl-cyclopentyl group, a 1-ethyl-cyclobutyl group, a 2-ethyl-cyclobutyl group, a 3-ethyl-cyclobutyl group, a 1,2-dimethyl-cyclobutyl group, a 1,3-dimethyl-cyclobutyl group, a 2,2-dimethyl-cyclobutyl group, a 2,3-dimethyl-cyclobutyl group, a 2,4-dimethyl-cyclobutyl group, a 3,3-dimethyl-cyclobutyl group, a 1-n-propyl-cyclopropyl group, a 2-n-propyl-cyclopropyl group, a 1-i-propyl-cyclopropyl group, a 2-i-propyl-cyclopropyl group, a 1,2,2-trimethyl-cyclopropyl group, a 1,2,3-trimethyl-cyclopropyl group, a 2,2,3-trimethyl-cyclopropyl group, a 1-ethyl-2-methyl-cyclopropyl group, a 2-ethyl-1-methyl-cyclopropyl group, a 2-ethyl-2-methyl-cyclopropyl group, and a 2-ethyl-3-methyl-cyclopropyl group.

m1 satisfies the relationship: $1 \leq m1 \leq 6-m2$, m2 satisfies the relationship: $1 \leq m2 \leq 5$, m3 satisfies the relationship: $1 \leq m3 \leq 4-m2$, and m4 satisfies the relationship: $1 \leq m4 \leq 3$.

Examples of the compounds, polymers, and oligomers of the formulae (5-1) and (5-2) are shown below.

[Chemical formula 11]

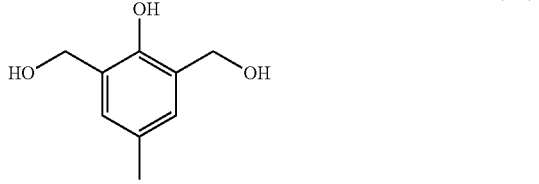

formula(6-1)

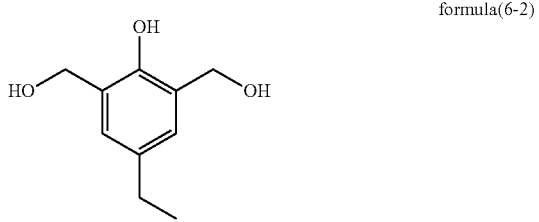

formula(6-2)

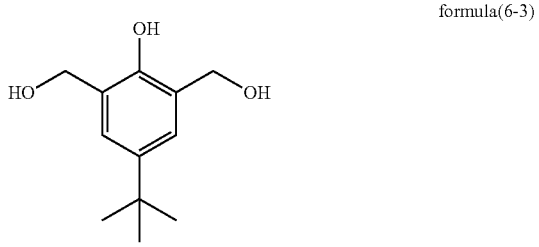

formula(6-3)

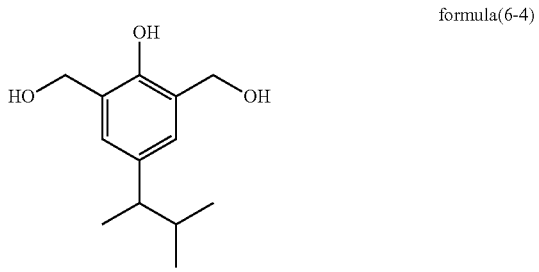

formula(6-4)

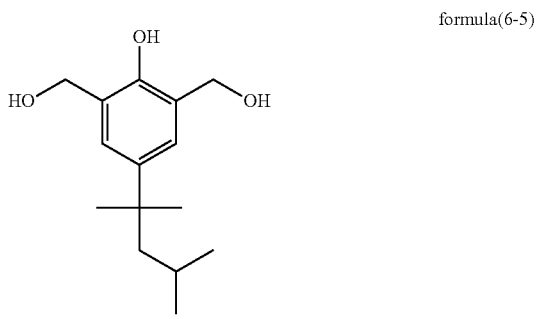

formula(6-5)

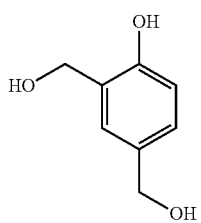
formula(6-6)
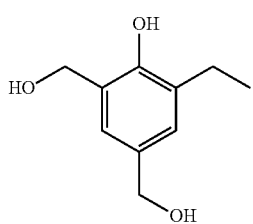
formula(6-6)
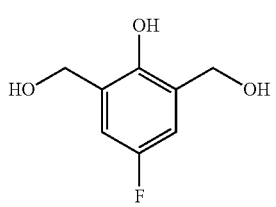
formula(6-7)
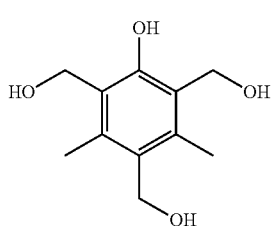
formula(6-8)
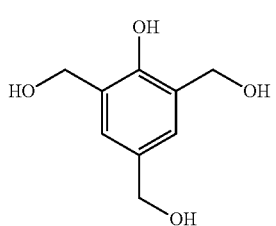
formula(6-9)
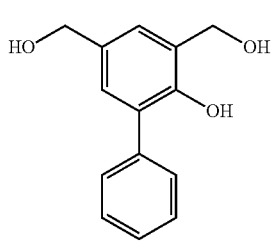
formula(6-10)
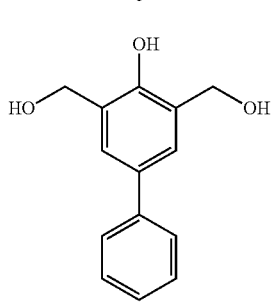
formula(6-11)
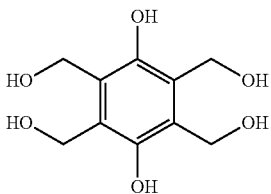
formula(6-12)
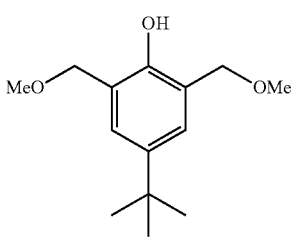
formula(6-13)
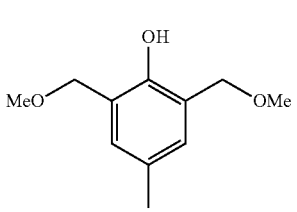
formula(6-14)
[Chemical formula 12]
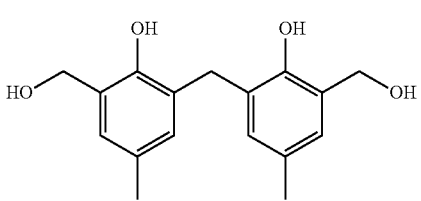
formula(6-15)
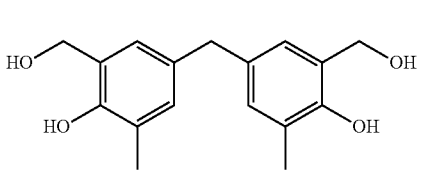
formula(6-16)
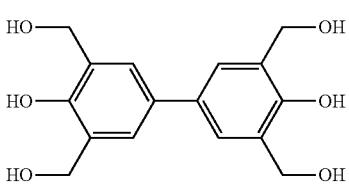
formula(6-17)
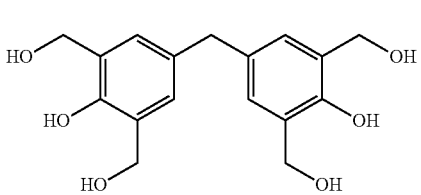
formula(6-18)
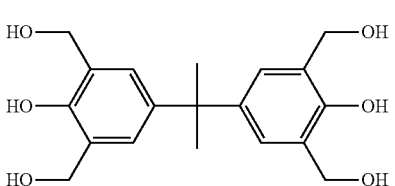
formula(6-19)

-continued formula(6-20)
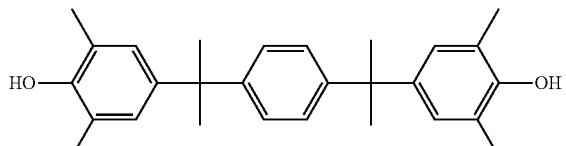

formula(6-21)
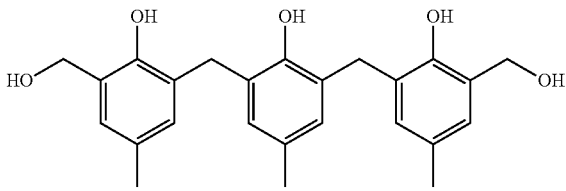

formula(6-22)
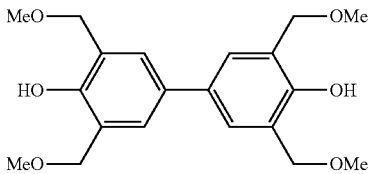

formula(6-23)
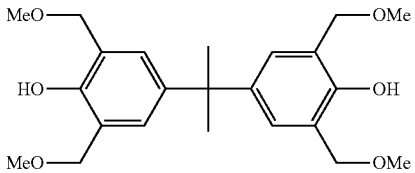

formula(6-24)
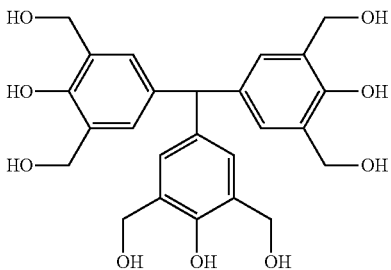

formula(6-25)
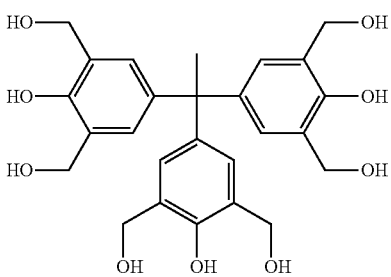

-continued formula(6-26)
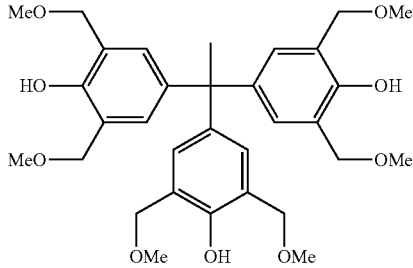

The above-mentioned compounds are available as products of Asahi Yukizai Corporation and Honshu Chemical Industry Co., Ltd. For example, among the above-mentioned crosslinking agents, the compound of formula (6-22) is available as trade name: TMOM-BP, manufactured by Asahi Yukizai Corporation. The amount of the crosslinking agent added varies depending on, for example, the application solvent used, the substrate used, the required solution viscosity, or the required film form, but ranges 0.001 to 80% by weight, preferably 0.01 to 50% by weight, further preferably 0.1 to 40% by weight, based on the total solid content of the resist underlayer film forming composition. The crosslinking agent possibly causes a crosslinking reaction due to self-condensation, but, when a crosslinkable substituent is present in the above-mentioned polymer in the present invention, the crosslinking agent and the crosslinkable substituent may together cause a crosslinking reaction.

[Surfactant]

The resist underlayer film forming composition of the present invention may contain, as an optional component, a surfactant for improving the application properties with respect to a semiconductor substrate. Examples of the surfactants include nonionic surfactants, e.g., polyoxyethylene alkyl ethers, such as polyoxyethylene lauryl ether, polyoxyethylene stearyl ether, polyoxyethylene cetyl ether, and polyoxyethylene oleyl ether; polyoxyethylene alkyl aryl ethers, such as polyoxyethylene octyl phenyl ether and polyoxyethylene nonyl phenyl ether; polyoxyethylene-polyoxypropylene block copolymers; sorbitan fatty acid esters, such as sorbitan monolaurate, sorbitan monopalmitate, sorbitan monostearate, sorbitan monooleate, sorbitan trioleate, and sorbitan tristearate; and polyoxyethylene sorbitan fatty acid esters, such as polyoxyethylene sorbitan monolaurate, polyoxyethylene sorbitan monopalmitate, polyoxyethylene sorbitan monostearate, polyoxyethylene sorbitan trioleate, and polyoxyethylene sorbitan tristearate, fluorine surfactants, such as EFTOP [registered trademark] EF301, EFTOP EF303, EFTOP EF352 (manufactured by Mitsubishi Materials Electronic Chemicals Co., Ltd.), MEGAFACE [registered trademark] F171, MEGAFACE F173, MEGAFACE R-30, MEGAFACE R-30N, MEGAFACE R-40, MEGAFACE R-40-LM (manufactured by DIC Corporation), Fluorad FC430, Fluorad FC431 (manufactured by Sumitomo 3M), and AsahiGuard [registered trademark] AG710, Surflon [registered trademark] S-382, Surflon SC101, Surflon SC102, Surflon SC103, Surflon SC104, Surflon SC105, Surflon SC106 (manufactured by Asahi Glass Co., Ltd.), and organosiloxane polymer KP341 (manufactured by Shin-Etsu Chemical Co., Ltd.). These surfactants may be used each alone or in combination. When the resist underlayer film forming composition contains a surfactant, the amount of the surfactant contained ranges 0.0001 to 10% by weight, preferably 0.01 to 5% by weight, based on the total solid content of the resist underlayer film forming composition.

The resist underlayer film forming composition of the present invention usually has a solid content of 0.1 to 70% by mass, preferably 0.1 to 60% by mass. The solid content indicates a content of the solid components remaining after removing the solvent from the total components of the resist underlayer film forming composition. The proportion of the compound or reaction product in the present invention in the solid components ranges preferably 1 to 100% by mass, 1 to 99.9% by mass, 50 to 99.9% by mass, 50 to 95% by mass, and 50 to 90% by mass with increasing preference.

[Other Components]

In the resist underlayer film forming composition of the present invention, for example, a light absorber, a rheology modifier, or a bonding auxiliary may be added. The rheology modifier is effective in improving the fluidity of the resist underlayer film forming composition. The bonding auxiliary is effective in improving the adhesion between a semiconductor substrate or a resist and the resist underlayer film. With respect to the light absorber, for example, a commercially available light absorber disclosed in "Kougyo-you Shikiso no Gijutsu to Shijou (Techniques and Markets of Industrial Dyes)" (CMC Publishing Co., Ltd.) or "Senryo Binran (Dye Handbook)" (edited by The Society of Synthetic Organic Chemistry, Japan), for example, C. I. Disperse Yellow 1, 3, 4, 5, 7, 8, 13, 23, 31, 49, 50, 51, 54, 60, 64, 66, 68, 79, 82, 88, 90, 93, 102, 114, and 124; C. I. Disperse Orange 1, 5, 13, 25, 29, 30, 31, 44, 57, 72, and 73; C. I. Disperse Red 1, 5, 7, 13, 17, 19, 43, 50, 54, 58, 65, 72, 73, 88, 117, 137, 143, 199, and 210; C. I. Disperse Violet 43; C. I. Disperse Blue 96; C. I. Fluorescent Brightening Agent 112, 135, and 163; C. I. Solvent Orange 2 and 45; C. I. Solvent Red 1, 3, 8, 23, 24, 25, 27, and 49; C. I. Pigment Green 10; and C. I. Pigment Brown 2 may be preferably used. The light absorber is incorporated usually in an amount of 10% by mass or less, preferably 5% by mass or less, based on the mass of the solid components of the resist underlayer film forming composition.

A rheology modifier is added mainly for the purpose of improving the fluidity of the resist underlayer film forming composition, particularly for improving the uniformity of the thickness of the resist underlayer film or the filling of the inside of hole with the resist underlayer film forming composition in the baking step. Specific examples of rheology modifiers include phthalic acid derivatives, such as dimethyl phthalate, diethyl phthalate, diisobutyl phthalate, dihexyl phthalate, and butylisodecyl phthalate; adipic acid derivatives, such as dinormalbutyl adipate, diisobutyl adipate, diisooctyl adipate, and octyldecyl adipate; maleic acid derivatives, such as dinormalbutyl maleate, diethyl maleate, and dinonyl maleate; oleic acid derivatives, such as methyl oleate, butyl oleate, and tetrahydrofurfuryl oleate; and stearic acid derivatives, such as normalbutyl stearate and glyceryl stearate. The rheology modifier is incorporated usually in an amount of less than 30% by mass, based on the mass of the solid components of the resist underlayer film forming composition.

A bonding auxiliary is added mainly for the purpose of improving the adhesion between a substrate or a resist and the resist underlayer film forming composition to prevent the resist from peeling off particularly in the development. Specific examples of bonding auxiliaries include chlorosilanes, such as trimethylchlorosilane, dimethylmethylolchlorosilane, methyldiphenylchlorosilane, and chloromethyldimethylchlorosilane; alkoxysilanes, such as trimethylmethoxysilane, dimethyldiethoxysilane, methyldimethoxysilane, dimethylmethylolethoxysilane, diphenyldimethoxysilane, and phenyltriethoxysilane; silazanes, such as hexamethyldisilazane, N,N'-bis(trimethylsilyl)urea, dimethyltrimethylsilylamine, and trimethylsilylimidazole; silanes, such as methyloltrichlorosilane, γ-chloropropyltrimethoxysilane, γ-aminopropyltriethoxysilane, and γ-glycidoxypropyltrimethoxysilane; heterocyclic compounds, such as benzotriazole, benzimidazole, indazole, imidazole, 2-mercaptobenzimidazole, 2-mercaptobenzothiazole, 2-mercaptobenzoxazole, urazole, thiouracil, mercaptoimidazole, and mercaptopyrimidine; and urea or thiourea compounds, such as 1,1-dimethylurea and 1,3-dimethylurea. The bonding auxiliary is incorporated usually in an amount of less than 5% by mass, preferably less than 2% by mass, based on the mass of the solid components of the resist underlayer film forming composition.

[Resist Underlayer Film, Resist Pattern, Semiconductor Device, and Method for Producing a Patterned Substrate]

Hereinbelow, a resist underlayer film produced using the resist underlayer film forming composition of the present invention, a method for forming a resist pattern, a method for producing a patterned substrate, and a method for producing a semiconductor device will be described.

The resist pattern in the present invention may be produced by applying the above-described resist underlayer film forming composition onto a semiconductor substrate and baking the applied composition.

Examples of semiconductor substrates to which the resist underlayer film forming composition of the present invention is applied include a silicon wafer, a germanium wafer, and compound semiconductor wafers, such as gallium arsenide, indium phosphide, gallium nitride, indium nitride, and aluminum nitride.

When a semiconductor substrate having an inorganic film formed on the surface thereof is used, the inorganic film is formed by, for example, an ALD (atomic layer deposition) method, a CVD (chemical vapor deposition) method, a reactive sputtering method, an ion plating method, a vacuum deposition method, or a spin coating method (spin on glass: SOG). Examples of the inorganic films include a polysilicon film, a silicon oxide film, a silicon nitride film, a BPSG (Boro-Phospho Silicate Glass) film, a titanium nitride film, a titanium nitride oxide film, a tungsten film, a gallium nitride film, and a gallium arsenide film.

The resist underlayer film forming composition of the present invention is applied onto the above-mentioned semiconductor substrate by an appropriate application method, such as a spinner or a coater. Then, the applied composition is baked using a heating means, such as a hotplate, to form a resist underlayer film. Conditions for baking are appropriately selected from those at a baking temperature of 100 to 400° C. for a baking time of 0.3 to 60 minutes. Preferred conditions for baking are those at a baking temperature of 120 to 350° C. for a baking time of 0.5 to 30 minutes, and more preferred conditions are those at a baking temperature of 150 to 300° C. for a baking time of 0.8 to 10 minutes.

The thickness of the formed resist underlayer film ranges, for example, 0.001 μm (1 nm) to 10 μm, preferably 0.002 μm (2 nm) to 1 μm, more preferably 0.005 μm (5 nm) to 0.5 μm (500 nm). When the temperature during the baking is lower than the above range, it is likely that crosslinking unsatisfactorily proceeds, making it difficult to obtain a resistance of the formed protective film to a resist solvent or a basic aqueous hydrogen peroxide solution. On the other hand, when the temperature during the baking is higher than the above range, the resist underlayer film is likely to suffer decomposition due to heat.

With respect to the photoresist formed on the resist underlayer film by application and baking according to a known method, there is no particular limitation as long as it is sensitive to a light used in the exposure. Any of a negative photoresist and a positive photoresist may be used. There are, for example, a positive photoresist comprising a novolak resin and 1,2-naphthoquinonediazidosulfonate, a chemical amplification photoresist comprising a binder having a group which is decomposed due to an acid to increase the alkali solubility, and a photo-acid generator, a chemical amplification photoresist comprising a low-molecular weight compound which is decomposed due to an acid to increase the alkali solubility of the photoresist, an alkali-soluble binder, and a photo-acid generator, and a chemical amplification photoresist comprising a binder having a group which is decomposed due to an acid to increase the alkali solubility, a low-molecular weight compound which is decomposed due to an acid to increase the alkali solubility of the photoresist, and a photo-acid generator. Examples thereof include trade name: V146G, manufactured by JSR Corporation, trade name: APEX-E, manufactured by Shipley Company, Inc., trade name: PAR710, manufactured by Sumitomo Chemical Co., Ltd., and trade name: AR2772, SEPR430, manufactured by Shin-Etsu Chemical Co., Ltd. Further, they include fluorine atom-containing polymer photoresists described in, for example, Proc. SPIE, Vol. 3999, 330-334 (2000), Proc. SPIE, Vol. 3999, 357-364 (2000), and Proc. SPIE, Vol. 3999, 365-374 (2000).

Exposure through a mask (reticle) for forming a predetermined pattern is conducted, and, for example, an i-line, a KrF excimer laser, an ArF excimer laser, an EUV (extreme ultraviolet light), or an EB (electron beam) is used. In development, an alkaline developer is used, and conditions are appropriately selected from those at a development temperature of 5 to 50° C. for a development time of 10 to 300 seconds. The alkaline developer that can be used are, for example, an aqueous solution of an alkali, e.g., an inorganic alkali, such as sodium hydroxide, potassium hydroxide, sodium carbonate, sodium silicate, sodium metasilicate, or aqueous ammonia; a primary amine, such as ethylamine or n-propylamine; a secondary amine, such as diethylamine or di-n-butylamine; a tertiary amine, such as triethylamine or methyldiethylamine; an alcohol amine, such as dimethylethanolamine or triethanolamine; a quaternary ammonium salt, such as tetramethylammonium hydroxide, tetraethylammonium hydroxide, or choline; or a cyclic amine, such as pyrrole or piperidine. Further, those which can be used are the above-mentioned aqueous alkali solution which has added thereto an alcohol, such as isopropyl alcohol, or a surfactant, such as a nonionic surfactant, in an appropriate amount. Of these, a preferred developer is a quaternary ammonium salt, and further preferred are tetramethylammonium hydroxide and choline. Further, for example, a surfactant may be added to the above developer. Instead of the method using an alkaline developer, a method may be used in which development is conducted using an organic solvent, such as butyl acetate, to develop a portion of the photoresist in which the alkali dissolution rate is not improved.

Then, using the formed resist pattern as a mask, the resist underlayer film is subjected to dry etching. In this instance, when the above-mentioned inorganic film is formed on the surface of the semiconductor substrate, the surface of the inorganic film is exposed, and, when the inorganic film is not formed on the surface of the semiconductor substrate, the surface of the semiconductor substrate is exposed.

EXAMPLES

Hereinbelow, the present invention will be described in more detail with reference to the following Examples, which should not be construed as limiting the scope of the present invention.

The apparatus and other conditions used in the measurement of the weight average molecular weight of the polymers obtained in the following Synthesis Examples are shown below.
Apparatus: HLC-8320GPC, manufactured by Tosoh Corp.
GPC Column: Shodex [registered trademark]-Asahipak [registered trademark] (Showa Denko K.K.)
Column temperature: 40° C.
Flow rate: 0.6 mL/minute
Eluent: N,N-Dimethylformamide (DMF)
Standard sample: Polystyrene (Tosoh Corp.)

Example 1

To 4.00 g of 1,3,5-tris(2,3-epoxypropyl) isocyanurate (product name: TEPIC-SS, manufactured by Nissan Chemical Corporation), 7.42 g of dithiodiglycolic acid, and 0.38 g of ethyltriphenylphosphonium bromide in a reaction flask was added 47.19 g of propylene glycol monomethyl ether, and the resultant mixture was heated at 100° C. in a nitrogen gas atmosphere while stirring for 20 hours to obtain a transparent solution of a reaction product. A reaction product which corresponds to formula (C-1) was obtained, and had a weight average molecular weight Mw of 880, as determined by GPC using a conversion calibration curve obtained from the standard polystyrene. In formula (C-1), a:b=100: 300 (molar ratio).

To 6.65 g of the solution of the reaction product which corresponds to formula (C-1) (having a solid content of 17.5% by weight) were added 0.03 g of pyridinium trifluoromethanesulfonate as a crosslinking acid catalyst, 0.001 g of a surfactant (product name: MEGAFACE [trade name] R-40, manufactured by DIC Corporation; fluorine surfactant), 11.43 g of propylene glycol monomethyl ether, and 1.88 g of propylene glycol monomethyl ether acetate to prepare a resist underlayer film forming composition for lithography in the form of a solution.

[Chemical formula 13]

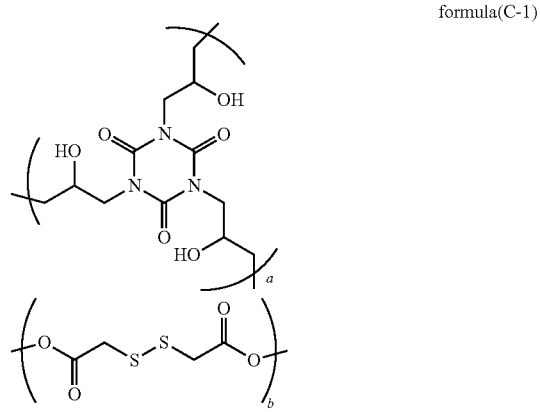

formula(C-1)

Example 2

To 4.00 g of 1,3,5-tris(2,3-epoxypropyl) isocyanurate (product name: TEPIC-SS, manufactured by Nissan Chemical Corporation), 8.56 g of 3,3'-dithiodipropionic acid, and 0.38 g of ethyltriphenylphosphonium bromide in a reaction flask was added 51.76 g of propylene glycol monomethyl ether, and the resultant mixture was heated at 100° C. in a nitrogen gas atmosphere while stirring for 21 hours to obtain a transparent solution of a reaction product. A reaction product which corresponds to formula (C-2) was obtained in the form of a solution, and had a weight average molecular weight Mw of 5,700, as determined by GPC using a conversion calibration curve obtained from the standard polystyrene. In formula (C-2), a:b=100:300 (molar ratio).

To 7.09 g of the solution of the reaction product which corresponds to formula (C-2) (having a solid content of 16.4% by weight) were added 0.03 g of pyridinium trifluoromethanesulfonate as a crosslinking acid catalyst, 0.001 g of a surfactant (product name: MEGAFACE [trade name] R-40, manufactured by DIC Corporation; fluorine surfactant), 11.00 g of propylene glycol monomethyl ether, and 1.88 g of propylene glycol monomethyl ether acetate to prepare a resist underlayer film forming composition for lithography in the form of a solution.

[Chemical formula 14]

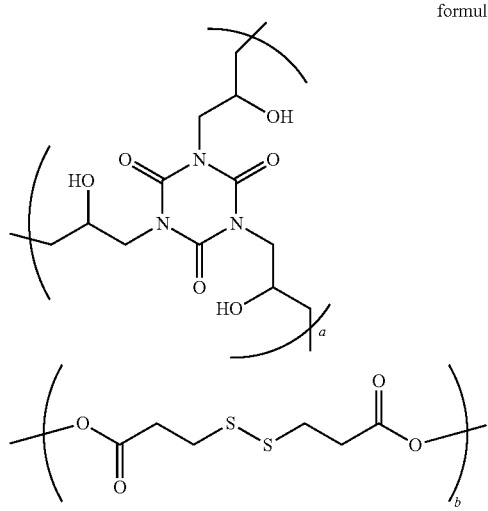

formula(C-2)

Example 3

To 4.00 g of 1,3,5-tris(2,3-epoxypropyl) isocyanurate (product name: TEPIC-SS, manufactured by Nissan Chemical Corporation), 4.40 g of 3,3'-dithiodipropionic acid, 1.59 g of glycolic acid, and 0.39 g of ethyltriphenylphosphonium bromide in a reaction flask was added 41.51 g of propylene glycol monomethyl ether, and the resultant mixture was heated at 100° C. in a nitrogen gas atmosphere while stirring for 15 hours to obtain a transparent solution of a reaction product. A reaction product which corresponds to formula (C-3) was obtained, and had a weight average molecular weight Mw of 1,400, as determined by GPC using a conversion calibration curve obtained from the standard polystyrene. In formula (C-3), a:b:c=100:150:150 (molar ratio).

To 6.41 g of the solution of the reaction product which corresponds to formula (C-3) (having a solid content of 18.2% by weight) were added 0.03 g of pyridinium trifluoromethanesulfonate as a crosslinking acid catalyst, 0.001 g of a surfactant (product name: MEGAFACE [trade name] R-40, manufactured by DIC Corporation; fluorine surfactant), 11.67 g of propylene glycol monomethyl ether, and 1.88 g of propylene glycol monomethyl ether acetate to prepare a resist underlayer film forming composition for lithography in the form of a solution.

[Chemical formula 15]

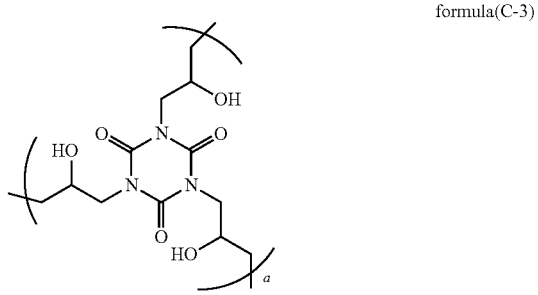

formula(C-3)

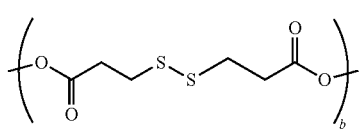

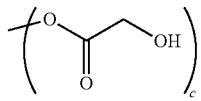

Synthesis Example 1

38.70 g of tricarboxymethyl isocyanurate (TAICA) synthesized in accordance with the method described in the specification of U.S. Pat. No. 3,230,220, 300.00 g of N-methyl-2-pyrrolidone (manufactured by Kanto Chemical Co., Inc.), 70.91 g of allyl bromide (manufactured by Tokyo Chemical Industry Co. Ltd.), and 79.38 g of potassium carbonate (manufactured by Kanto Chemical Co., Inc.) were charged, and the temperature of the resultant mixture was increased to 80 to 90° C. Then, a reaction was conducted for 2 hours, confirming that the constant weight in the reaction was achieved. After completion of the reaction, 580.50 g of toluene (manufactured by Kanto Chemical Co., Inc.) was added to the resultant reaction mixture. The reaction mixture was subjected to filtration, and the filtrate was washed with 580.50 g of water three times. The organic layer was concentrated and dried and then, 387.00 g of ethanol (manufactured by Kanto Chemical Co., Inc.) was charged into the concentrate, and the resultant mixture was stirred at 20 to 30° C. for 30 minutes. The stirring was stopped, and then the mixture was subjected to filtration, and the resultant crystal was dried. 44.32 g of an intended product (triallyl acetate isocyanurate: TAAICA) represented by formula (M-1) was obtained in a yield of 85%.

[Chemical formula 16]

formula(M-1)

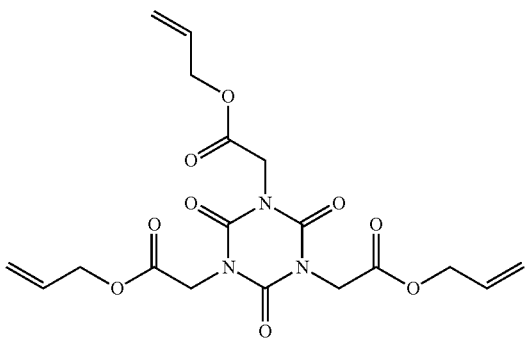

Synthesis Example 2

44.32 g of TAAICA synthesized in Synthesis Example 1 and 443.20 g of chloroform (manufactured by Kanto Chemical Co., Inc.) were charged, and to the resultant mixture was added 125.06 g of m-chloroperbezoic acid (manufactured by Tokyo Chemical Industry Co. Ltd.). The resultant mixture was subjected to reaction for 47 hours. After completion of the reaction, 88.64 g of chloroform (manufactured by Kanto Chemical Co., Inc.) was added to the reaction mixture. Further, the reaction mixture was washed with 886.40 g of 5% sodium hydrogencarbonate (manufactured by Kanto Chemical Co., Inc.). Subsequently, the reaction mixture was washed with 443.20 g of 10% sodium sulfite (manufactured by Kanto Chemical Co., Inc.) and 886.40 g of 5% sodium hydrogencarbonate (manufactured by Kanto Chemical Co., Inc.), and further washed with 443.20 g of water twice. After concentration, the resultant concentrate was purified by a column treatment. After the purification by a column treatment, 41.31 g of an intended product (triglycidyl acetate isocyanurate: TAGICA) represented by formula (A-13) was obtained in a yield of 84%.

[Chemical formula 17]

formula(A-13)

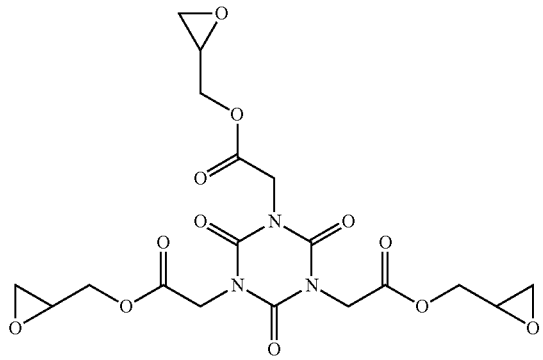

Example 4

To 9.00 g of TAGICA obtained in Synthesis Example 2, 6.99 g of dithiodiglycolic acid, and 0.53 g of ethyltriphenylphosphonium bromide in a reaction flask was added 66.11 g of propylene glycol monomethyl ether, and the resultant mixture was heated at 70° C. in a nitrogen gas atmosphere while stirring for 23 hours to obtain a transparent reaction product which corresponds to formula (C-4), and the reaction product had a weight average molecular weight Mw of 3,000, as determined by GPC using a conversion calibration curve obtained from the standard polystyrene. In formula (C-4), a:b=100:200 (molar ratio).

To 8.31 g of the solution of the reaction product which corresponds to formula (C-4) (having a solid content of 11.56% by weight) were added 0.04 g of pyridinium trifluoromethanesulfonate as a crosslinking acid catalyst, 0.001 g of a surfactant (product name: MEGAFACE [trade name] R-40, manufactured by DIC Corporation; fluorine surfactant), 9.75 g of propylene glycol monomethyl ether, and 1.90 g of propylene glycol monomethyl ether acetate to prepare a resist underlayer film forming composition for lithography in the form of a solution.

[Chemical formula 18]

formula(C-4)

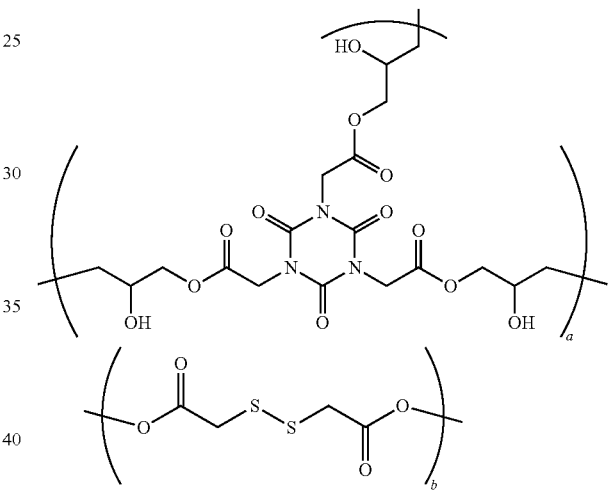

Comparative Example 1

To 6.00 g of monoallyldiglycidyl isocyanurate (product name: MADGIC, manufactured by Shikoku Chemicals Corporation), 4.70 g of 3,3'-dithiodipropionic acid, and 0.40 g of ethyltriphenylphosphonium bromide in a reaction flask was added 44.39 g of propylene glycol monomethyl ether, and the resultant mixture was heated at 100° C. in a nitrogen gas atmosphere while stirring for 24 hours to obtain a transparent solution of a reaction product. A reaction product which corresponds to formula (D-1) was obtained, and had a weight average molecular weight Mw of 3,900, as determined by GPC using a conversion calibration curve obtained from the standard polystyrene. In formula (D-1), a:b=100: 105 (molar ratio).

To 6.78 g of the solution of the reaction product which corresponds to formula (D-1) (having a solid content of 17.0% by weight) were added 0.05 g of pyridinium trifluoromethanesulfonate as a crosslinking acid catalyst, 0.001 g of a surfactant (product name: MEGAFACE [trade name] R-40, manufactured by DIC Corporation; fluorine surfactant), 11.30 g of propylene glycol monomethyl ether, and 1.88 g of propylene glycol monomethyl ether acetate to prepare a resist underlayer film forming composition for lithography in the form of a solution.

[Chemical formula 19]

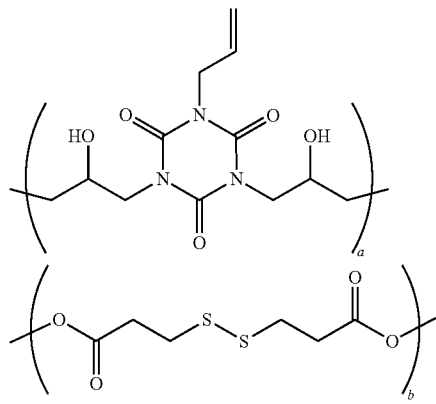

formula(D-1)

Comparative Example 2

To 15.00 g of diglycidyldimethylhydantoin (product name: DG-DMH, manufactured by Shikoku Chemicals Corporation; 30% by weight propylene glycol monomethyl ether solution), 4.32 g of 3,3'-dithiodipropionic acid, and 0.36 g of ethyltriphenylphosphonium bromide in a reaction flask was added 10.84 g of propylene glycol monomethyl ether, and the resultant mixture was heated at 100° C. in a nitrogen gas atmosphere while stirring for 24 hours to obtain a transparent solution of a reaction product. A reaction product which corresponds to formula (D-2) was obtained, and had a weight average molecular weight Mw of 3,500, as determined by GPC using a conversion calibration curve obtained from the standard polystyrene. In formula (D-2), a:b=100:105 (molar ratio).

To 9.29 g of the solution of the reaction product which corresponds to formula (D-2) (having a solid content of 12.4% by weight) were added 0.04 g of pyridinium trifluoromethanesulfonate as a crosslinking acid catalyst, 0.001 g of a surfactant (product name: MEGAFACE [trade name] R-40, manufactured by DIC Corporation; fluorine surfactant), 8.79 g of propylene glycol monomethyl ether, and 1.88 g of propylene glycol monomethyl ether acetate to prepare a resist underlayer film forming composition for lithography in the form of a solution.

[Chemical formula 20]

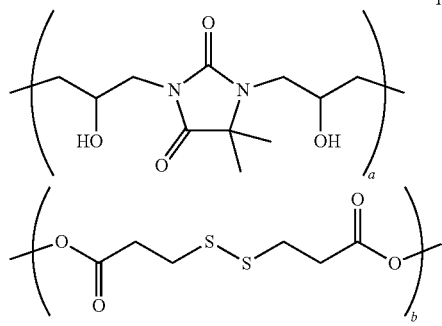

formula(D-2)

Comparative Example 3

To 6.00 g of diglycidyl terephthalate (product name: Denacol EX-711, manufactured by Nagase Chemtex Corporation), 4.56 g of 3,3'-dithiodipropionic acid, and 0.38 g of ethyltriphenylphosphonium bromide in a reaction flask was added 43.77 g of propylene glycol monomethyl ether, and the resultant mixture was heated at 100° C. in a nitrogen gas atmosphere while stirring for 24 hours to obtain a transparent solution of a reaction product. A reaction product which corresponds to formula (D-3) was obtained, and had a weight average molecular weight Mw of 4,500, as determined by GPC using a conversion calibration curve obtained from the standard polystyrene. In formula (D-3), a:b=100:105 (molar ratio).

To 7.82 g of the solution of the reaction product which corresponds to formula (D-3) (having a solid content of 14.8% by weight) were added 0.04 g of pyridinium trifluoromethanesulfonate as a crosslinking acid catalyst, 0.001 g of a surfactant (product name: MEGAFACE [trade name] R-40, manufactured by DIC Corporation; fluorine surfactant), 10.25 g of propylene glycol monomethyl ether, and 1.88 g of propylene glycol monomethyl ether acetate to prepare a resist underlayer film forming composition for lithography in the form of a solution.

[Chemical formula 21]

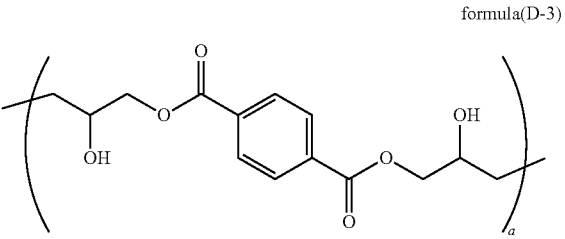

formula(D-3)

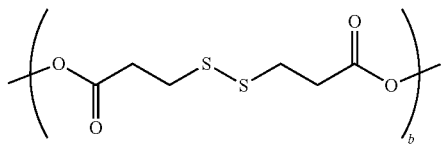

Comparative Example 4

To 4.00 g of 1,3,5-tris(2,3-epoxypropyl) isocyanurate (product name:

TEPIC-SS, manufactured by Nissan Chemical Corporation), 6.11 g of 2,2'-thiodiglycolic acid, and 0.38 g of ethyltriphenylphosphonium bromide in a reaction flask was added 41.97 g of propylene glycol monomethyl ether, and the resultant mixture was heated at 100° C. in a nitrogen gas atmosphere while stirring for 21 hours. Preparation of a solution of a resin which corresponds to formula (D-4) was attempted as mentioned above, but part of the reaction product was deposited as an insoluble material. In formula (D-4), a:b=100:300 (molar ratio).

[Chemical formula 22]

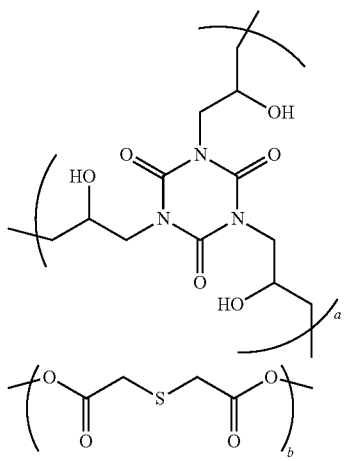

formula(D-4)

Comparative Example 5

To 4.00 g of 1,3,5-tris(2,3-epoxypropyl) isocyanurate (product name: TEPIC-SS, manufactured by Nissan Chemical Corporation), 7.99 g of methylenebis(thioglycolic acid), and 0.38 g of ethyltriphenylphosphonium bromide in a reaction flask was added 49.47 g of propylene glycol monomethyl ether, and the resultant mixture was heated at 100° C. in a nitrogen gas atmosphere while stirring for 21 hours. Preparation of a solution of a resin which corresponds to formula (D-5) was attempted as mentioned above, but part of the reaction product was deposited as an insoluble material. In formula (D-5), a:b=100:300 (molar ratio).

[Chemical formula 23]

formula(D-5)

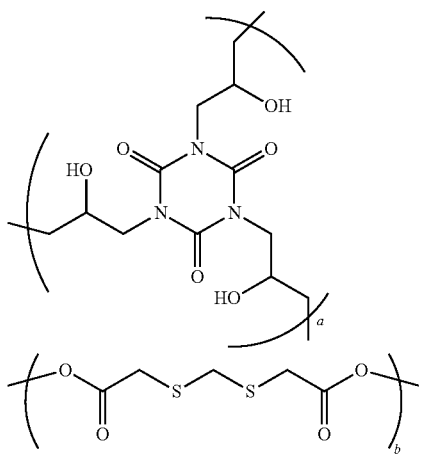

Comparative Example 6

To 4.00 g of 1,3,5-tris(2,3-epoxypropyl) isocyanurate (product name: TEPIC-SS, manufactured by Nissan Chemical Corporation), 8.56 g of (ethylenedithio)diacetic acid, and 0.38 g of ethyltriphenylphosphonium bromide in a reaction flask was added 51.76 g of propylene glycol monomethyl ether, and the resultant mixture was heated at 100° C. in a nitrogen gas atmosphere while stirring for 21 hours. Preparation of a solution of a resin which corresponds to formula (D-6) was attempted as mentioned above, but part of the reaction product was deposited as an insoluble material. In formula (D-6), a:b=100:300 (molar ratio).

[Chemical formula 24]

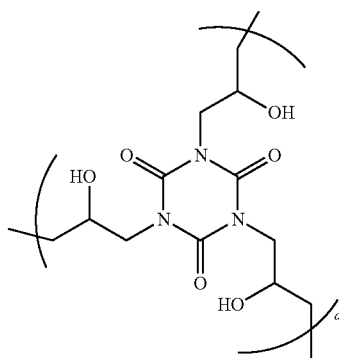

formula(D-6)

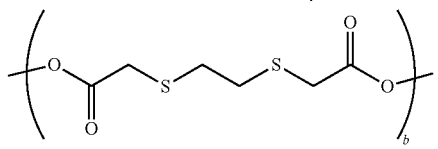

[Evaluation of Dissolution of the Reaction Product]

The respective states of the reaction solutions each containing a reaction product obtained in Examples 1 to 4 and Comparative Examples 1 to 6 are shown in Table 1.

TABLE 1

| Example | State of reaction solution containing reaction product |
|---|---|
| Example 1 | Transparent solution |
| Example 2 | Transparent solution |
| Example 3 | Transparent solution |
| Example 4 | Transparent solution |
| Comparative Example 1 | Transparent solution |
| Comparative Example 2 | Transparent solution |
| Comparative Example 3 | Transparent solution |
| Comparative Example 4 | Insoluble material deposited |
| Comparative Example 5 | Insoluble material deposited |
| Comparative Example 6 | Insoluble material deposited |

As apparent from the above results, in Examples 1 to 4, the reaction solution containing the reaction product obtained from a tri- or higher functional compound containing epoxy groups and a dicarboxylic acid comprising a disulfide linkage was in a uniform solution state, whereas, in Comparative Examples 4 to 6, the reaction product obtained from a tri- or higher functional compound containing epoxy groups and a dicarboxylic acid containing no disulfide linkage caused deposition of insoluble materials in the reaction solution. Accordingly, the reaction product obtained in each of Examples 1 to 4 exhibits high dissolution in the reaction solvent (propylene glycol monomethyl ether) which is a resist solvent, and therefore can be advantageously used as a resist underlayer film forming composition.

[Evaluation of Resistance to Resist Solvent]

The resist underlayer film forming compositions for lithography prepared in each of Examples 1 to 4 and Comparative Examples 1 to 3 was applied onto a silicon wafer using a spin coater (spin coating). The applied composition was baked on a hotplate at 215° C. or 250° C. for one minute to form a resist underlayer film having a thickness of 200 nm. A thickness of the resist underlayer film was measured using an optical interference film thickness meter (Nanospec AFT6100, manufactured by Nanometrics Inc.). Then, for evaluating a resistance to resist solvent of the resist underlayer film formed on the wafer, the formed resist underlayer film was immersed in a mixed solvent of propylene glycol monomethyl ether and propylene glycol monomethyl ether acetate in a weight ratio of 7:3 for one minute, and subjected to spin drying and then baked at 100° C. for 30 seconds. The thickness of the resist underlayer film before and after immersion in the mixed solvent was measured.

A resistance to resist solvent was evaluated as follows. From the equation ((Thickness of the film before immersion in the solvent)−(Thickness of the film after immersion in the solvent))÷(Thickness of the film before immersion in the solvent))×100, a thickness reduction ratio (%) of the resist underlayer film removed by immersion in the solvent was calculated to evaluate the resistance to resist solvent. A film having a thickness reduction ratio of about 1% or less is considered to have a satisfactory resistance to resist solvent. The thickness reduction ratio (%) of the resist underlayer film is shown in Table 2.

[Evaluation of an Optical Coefficient]

The resist underlayer film forming compositions for lithography prepared in each of Examples 1 to 4 and Comparative Examples 1 to 3 was applied onto a silicon wafer using a spin coater (spin coating). The applied composition was heated on a hotplate at 215° C. or 250° C. for one minute to form a film having a thickness of 50 nm. With respect to the formed resist underlayer film, using a spectroscopic ellipsometer (VUV-VASE, manufactured by J. A. Woolam Co., Inc.), an n value (refractive index) and a k value (attenuation coefficient) at a wavelength of 193 nm were measured. The results are shown in Table 2.

[Evaluation of Etch Selectivity]

The resist underlayer film forming compositions for lithography prepared in each of Examples 1 to 4 and Comparative Examples 1 to 3 was applied onto a silicon wafer, and heated at 215° C. or 250° C. for one minute to form a film having a thickness of 200 nm. Each of the formed films was subjected to dry etching by nitrogen gas for 60 seconds using a dry etching machine (RIE-10NR), manufactured by Samco Inc., to measure a dry etching rate of the resist underlayer film. An etch selectivity of each resist underlayer film calculated when the etch selectivity of the resist underlayer film obtained from Comparative Example 1 is taken as 1 is shown in Table 2.

TABLE 2

| Example | Baking temperature | Resistance to resist solvent (Thickness reduction ratio) | n/k | Etch selectivity (Comparative Example 1 = 1) |
|---|---|---|---|---|
| Example 1 | 215° C. | 0.1% | 1.96/0.24 | 1.49 |
| Example 2 | 215° C. | 0.2% | 1.94/0.24 | 1.22 |
| Example 3 | 215° C. | 0.1% | 1.91/0.23 | 1.17 |
| Example 4 | 250° C. | 0.7% | 1.90/0.12 | 1.73 |
| Comparative Example 1 | 215° C. | 0.4% | 1.98/0.27 | 1.00 |
| Comparative Example 2 | 215° C. | 0.1% | 1.83/0.15 | 0.98 |
| Comparative Example 3 | 215° C. | 0.1% | 1.68/0.38 | 0.68 |

As apparent from the above results, the films obtained in Examples 1 to 4 exhibit satisfactory solvent resistance to the resist solvent, and therefore can be advantageously used as a resist underlayer film. Further, the films in Examples 1 to 4 have a k value at a wavelength of 193 nm, and therefore can suppress reflection from the substrate side as a resist underlayer film for lithography and thus they function also as an antireflection film. Moreover, the films in Examples 1 to 4 have an even higher etch selectivity than that in Comparative Examples 1 to 3. Therefore, the resist underlayer film forming composition for lithography obtained by the present invention can reduce the etching time for dry etching of the resist underlayer film, making it possible to suppress an unfavorable phenomenon such that the thickness of the resist film is reduced when removing the resist underlayer film by dry etching. Further, a reduction of the dry etching time can suppress etching damage which is unfavorable to the substrate for the resist underlayer film, and therefore the resist underlayer film obtained from the composition of the present invention is especially useful as a resist underlayer film.

INDUSTRIAL APPLICABILITY

The resist underlayer film forming composition of the present invention provides a resist underlayer film having especially high dry etching rate.

The invention claimed is:

1. A resist underlayer film forming composition comprising a solvent and a reaction product of a tri- or higher functional compound and a bi- or higher functional compound having at least one disulfide linkage,
   wherein the tri- or higher functional compound is a compound containing three or more epoxy groups,
   wherein the bi- or higher functional compound is a dicarboxylic acid comprising a disulfide linkage, and
   wherein the functional groups of the tri- or higher functional compound are the same.

2. The resist underlayer film forming composition according to claim 1, wherein the dicarboxylic acid comprising a disulfide linkage is represented by the following formula (1):

[Chemical formula 1]

HOOC—$X_1$—S—S—$X_2$—COOH    formula(1)

wherein each of $X_1$ and $X_2$ independently represents an unsubstituted or substituted alkylene group having 1 to 10 carbon atoms, an unsubstituted or substituted arylene group having 6 to 40 carbon atoms, or a combination thereof.

3. The resist underlayer film forming composition according to claim 2, wherein, in formula (1), each of $X_1$ and $X_2$ is independently an alkylene group having 1 to 3 carbon atoms.

4. The resist underlayer film forming composition according to claim 1, wherein the tri- or higher functional compound comprises a heterocyclic structure.

5. The resist underlayer film forming composition according to claim 4, wherein the heterocyclic structure comprises a triazine structure.

6. The resist underlayer film forming composition according to claim 1, which further comprises a crosslinking catalyst.

7. The resist underlayer film forming composition according to claim 1, which further comprises a crosslinking agent.

8. The resist underlayer film forming composition according to claim 1, which further comprises a surfactant.

9. A resist underlayer film, which is a baked material of an applied film comprising the resist underlayer film forming composition according to claim 1.

10. A method for forming a resist pattern for use in producing a semiconductor device, the method comprising the steps of: applying the resist underlayer film forming composition according to claim 1 onto a semiconductor substrate and baking the applied composition to form a resist underlayer film; applying a resist onto the resist underlayer film and baking the applied resist to form a resist film; subjecting the semiconductor substrate covered with the resist underlayer film and the resist film to exposure; and subjecting the exposed resist film to development.

11. A method for producing a semiconductor device, comprising the steps of:
    forming a resist underlayer film comprising the resist underlayer film forming composition according to claim 1 on a semiconductor substrate;
    forming a resist film on the resist underlayer film;
    irradiating the resist film with a light or an electron beam to form an irradiated resist film and subjecting the irradiated resist film to development to form a resist pattern;
    etching the resist underlayer film through the formed resist pattern to form a patterned resist underlayer film; and
    processing the semiconductor substrate using the patterned resist underlayer film.

12. A method for producing a patterned substrate, comprising the steps of: applying the resist underlayer film forming composition according to claim 1 onto a semiconductor substrate and baking the applied composition to form a resist underlayer film; applying a resist onto the resist underlayer film and baking the applied resist to form a resist film; subjecting the semiconductor substrate covered with the resist underlayer film and the resist film to exposure; and subjecting the exposed resist film to development to perform patterning.

* * * * *